(12) United States Patent
Feng et al.

(10) Patent No.: US 7,847,306 B2
(45) Date of Patent: Dec. 7, 2010

(54) LIGHT EMITTING DIODE DEVICE, METHOD OF FABRICATION AND USE THEREOF

(75) Inventors: Jian Feng, Hong Kong (CN); Hung-Shen Chu, Hsinchu (TW); Shengmei Zheng, Hong Kong (CN)

(73) Assignee: Hong Kong Applied Science and Technology Research Insitute Company, Ltd., Shatin, New Territories (HK)

( * ) Notice: Subject to any disclaimer, the term of this patent is extended or adjusted under 35 U.S.C. 154(b) by 371 days.

(21) Appl. No.: 11/588,719

(22) Filed: Oct. 27, 2006

(65) Prior Publication Data

US 2008/0093607 A1    Apr. 24, 2008

(30) Foreign Application Priority Data

Oct. 23, 2006    (HK) .................................. 06111680

(51) Int. Cl.
*H01L 27/15* (2006.01)

(52) U.S. Cl. .............................. 257/98; 257/82; 257/94; 257/103

(58) Field of Classification Search .................. 257/79, 257/82, 94, 103, 98
See application file for complete search history.

(56) References Cited

U.S. PATENT DOCUMENTS

| | | | |
|---|---|---|---|
| 5,071,787 A | | 12/1991 | Mori et al. |
| 6,072,197 A * | | 6/2000 | Horino et al. ................ 257/103 |
| 6,265,766 B1 | | 7/2001 | Moden |
| 6,320,206 B1 * | | 11/2001 | Coman et al. .................. 257/94 |
| 6,340,831 B1 * | | 1/2002 | Kuhara et al. ................ 257/461 |
| 6,504,181 B2 * | | 1/2003 | Furukawa et al. ............. 257/98 |
| 6,679,621 B2 | | 1/2004 | West et al. |
| 6,729,746 B2 * | | 5/2004 | Suehiro et al. ............... 362/241 |
| 6,744,075 B2 * | | 6/2004 | Yamaguchi et al. ........... 257/99 |
| 6,787,435 B2 | | 9/2004 | Gibb et al. |
| 6,791,119 B2 | | 9/2004 | Slater, Jr. et al. |
| 6,831,302 B2 * | | 12/2004 | Erchak et al. ................. 257/87 |
| 6,899,443 B2 | | 5/2005 | Rizkin et al. |

(Continued)

FOREIGN PATENT DOCUMENTS

HK    06111680.6    10/2006

OTHER PUBLICATIONS

U.S. Appl. No. 11/516,564, filed Sep. 7, 2006; entitled "Light Emitting Diode Device and Manufacture and Use Thereof"; Feng et al.; 31 pp.

(Continued)

*Primary Examiner*—Wai-Sing Louie
*Assistant Examiner*—Bilkis Jahan
(74) *Attorney, Agent, or Firm*—Wells St. John, P.S.

(57) ABSTRACT

A light emitting diode device which, in use, has its light emitting region occupying a plane substantially perpendicular to a plane occupied by the surface on which the device is mounted. The primary light emission directions of the light emitting region are parallel to the surface on which the device is mounted. The device may have both its p-type and n-type semiconductor layers passivated by a layer or layers of light transmissive materials. There is a method for fabricating and mounting such a device. A plurality of the light emitting diode devices can be used in a lighting assembly for providing a plurality of independently controllable lit regions.

19 Claims, 7 Drawing Sheets

U.S. PATENT DOCUMENTS

| | | | |
|---|---|---|---|
| 6,995,402 B2 | 2/2006 | Ludowise et al. | |
| 7,012,283 B2 * | 3/2006 | Tsuda et al. | 257/103 |
| 7,058,252 B2 * | 6/2006 | Woodgate et al. | 385/16 |
| 7,125,734 B2 * | 10/2006 | Sackrison et al. | 438/25 |
| 7,296,312 B2 * | 11/2007 | Menkedick et al. | 5/611 |
| 2004/0062040 A1 | 4/2004 | Blume et al. | |
| 2004/0070337 A1 | 4/2004 | Goh et al. | |
| 2005/0001537 A1 | 1/2005 | West et al. | |
| 2005/0122487 A1 | 6/2005 | Koyama et al. | |
| 2005/0231978 A1 | 10/2005 | Kvenvold et al. | |
| 2006/0007103 A1 | 1/2006 | Oh et al. | |
| 2006/0152688 A1 | 7/2006 | Chen et al. | |

OTHER PUBLICATIONS

U.S. Appl. No. 11/707,517, filed Feb. 16, 2007; entitled Backlight Device and Liquid Crystal Display Incorporating the Backlight Device; Peng et al; 25 pp.

U.S. Appl. No. 11/881,039; filed Jul. 24, 2007; Lighting Device for Projecting a Beam of Light; Jian Feng et al.; 17 pp.

* cited by examiner

LIGHT EMITTING DIODE DEVICE, METHOD OF FABRICATION AND USE THEREOF

CROSS-REFERENCE TO RELATED APPLICATION

This application claims priority to Hong Kong Patent Application No. 06111680.6, which was filed Oct. 23, 2006.

BACKGROUND TO THE INVENTION

1. Field of the Invention

The present invention relates to light emitting diodes (LEDs) and to methods of fabricating LEDs. More particularly, the invention relates to an LED device having enhanced sideways light emission and a method of making such an LED. The invention also relates to use of LEDs.

2. Background Information

An LED is a special type of semiconductor diode made of direct bandgap semiconductor material. When a voltage is applied to the LED terminals electrons and holes flow into the p-n junction and when an electron meets a hole it falls into a lower energy level which releases a photon, the fundamental element of light.

Figure 1:
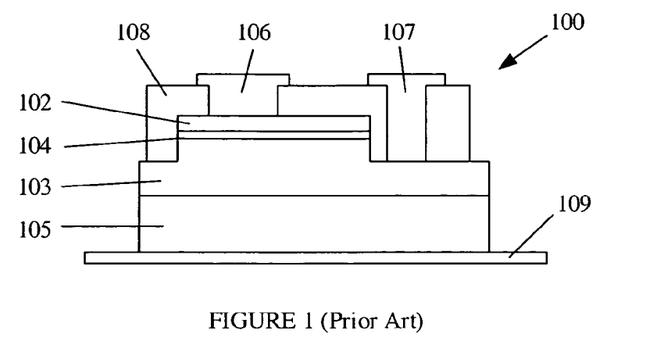
FIGS. 1 and 2 are schematic illustrations of prior art LEDs.
Figure 2:
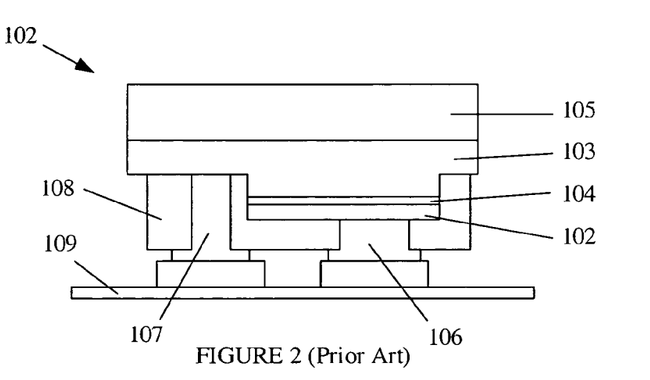

FIGS. 1 and 2 schematically illustrate known top-emitting 100 and flip-chip 102 LEDs. The LEDs have a similar structure comprising a layer of p-type semiconductor material 102, a layer of n-type semiconductor material 103 and a light generating region or p-n junction 104 formed on a substantially transparent substrate of a material 105 such as Sapphire. Terminals 106, 107 are connected to the p-type and n-type semiconductor materials 102, 103 for supplying power to the LED. A small part of the p-type material 102 and p-n junction 104 are removed by etching to expose the n-type material 103 for connection of the n-terminal 107. The LED structure is mounted to a supporting member 109.

When a voltage is applied to the terminals 106, 107 light is emitted from the p-n junction 104 in all directions. Maximum light emission is in a direction perpendicular to the p-n junction 104, which includes a direction towards the supporting member 109. Several techniques are available to recover this non-productive light emitted towards the supporting member 109 including adding a reflective surface to the supporting member 109 or using a reflective dish for the supporting member 109.

Additionally in certain applications, for example in backlight illumination systems for liquid crystal display panels, it may be desirable to have a LED's light emission pattern spread in a sideways direction. Hitherto this has been achieved by complicated optical designs.

These and other conventional solutions to deficiencies with prior LEDs may make LED fabrication more complicated and the LED packaging unnecessarily bulky. Accordingly, is an object of the present invention to provide a LED device which overcomes at least ameliorates some of the deficiencies exhibited by prior LEDs.

SUMMARY OF THE INVENTION

In a first aspect the invention provides for a light emitting diode device having its light emitting region occupying a plane substantially perpendicular to a plane occupied by the surface on which the device is to be mounted. Preferably, the light emitting diode device is edge-mounting, but may be mounted in other ways with its light emitting region occupying a plane substantially perpendicular to a plane occupied by the surface on which the device is to be mounted. The primary light emission directions of the light emitting region are parallel to the surface on which the device is edge mounted. The light emitting diode device can have both its p-type and n-type semiconductor layers passivated by a layer or layers of light transmissive materials. A reflective or opaque mask can be located at or adjacent the light emission directions of the device to reflect, re-direct or block light emissions in one direct and/or enhance light emissions in another direction.

In accordance with the forgoing, there is disclosed herein a light emitting diode device, for mounting on a surface, having a layer of p-type semiconductor material adjoining a layer of n-type semiconductor material and a light emitting region occupying a plane between the p- and n-type materials, wherein the light emitting diode device is fabricated for mounting with the plane occupied by the light emitting region substantially perpendicular to a plane occupied by the mounting surface.

There is also disclosed herein a light emitting diode device for mounting on a surface occupying a first plane has first and second primary light emission directions parallel to the first plane, and comprises a multi-layer semiconductor substrate comprising a first layer of a p-type semiconductor material, a second layer of a n-type semiconductor material located with the first layer forming a junction between the p- and n-type semiconductor materials and a light emission region occupying a second plane at the junction; and the light emitting diode device being fabricated for mounting on the surface with the second plane occupied by the light emission region substantially perpendicular to the first plane occupied by the surface.

Preferably the device further comprises a first terminal electrically connected to the p-type semiconductor material and a second terminal electrically connected to the n-type semiconductor material, and wherein the first and second terminals are located adjacent an edge of the light emitting diode device for making electrical connection with a circuit on the surface.

Preferably the device further comprises a light transmissive substrate on which the semiconductor substrate is formed and wherein the light transmissive substrate has a perimeter greater than a perimeter of the semiconductor substrate.

Preferably the device further comprises a light transmissive layer located on the semiconductor substrate and wherein the semiconductor substrate is sandwiched between the light transmissive substrate and the light transmissive layer.

Preferably the p- and n-type semiconductor materials are passivated by the light transmissive layer.

Preferably the light transmissive layer has a refractive index substantially similar to the refractive index of the light transmissive substrate.

Preferably the device further comprises a substantially light transmissive layer located at or adjacent the semiconductor substrate and having a first surface facing the semiconductor substrate and an opposed second surface, and a reflective surface formed at or adjacent the second surface of the light transmissive layer for directing at least a portion of emitted light in a direction away from the first emission direction so as to enhance light emission in the second emission direction.

Preferably the reflective surface is patterned to allow at least a portion of the light to propagate through the reflective surface.

Preferably the device further comprises a substantially light transmissive layer located at or adjacent the semiconductor substrate and having a first surface facing the semiconductor substrate and an opposed second surface, and a mask formed at or adjacent the second surface of the light transmissive layer for directing at least a portion of emitted light in the first emission direction, wherein the mask is patterned to allow at least a portion of the light to propagate through the mask.

In a second aspect the invention provides for a method of mounting a light emitting diode device so that a plane occupied by a light emitting region between the p-type and n-type semiconductor layers of the device is perpendicular to a plane occupied by the mounting surface.

Accordingly, there is disclosed herein a method of mounting the light emitting diode device comprises:
providing a light emitting diode device and a surface on which the light emitting diode device is to be mounted, orientating the surface in a first plane,
orientating the light emitting diode device so that a plane occupied by a light emitting region between the p-type and n-type semiconductor layers of the device is perpendicular to the first plane, and
bonding or securing the light emitting diode device to the surface.

In a third aspect the invention provides for, and there is disclosed herein, a method of fabricating a light emitting diode device, comprising on a first surface of a light transmissive substrate, forming a multi-layer semiconductor substrate comprising a first layer of a p-type semiconductor material, a second layer of a n-type semiconductor material located with the first layer for forming light emitting region at junction between the p- and n-type semiconductor materials, etching the multi-layer semiconductor substrate to expose positions of the first surface of the light transmissive substrate, attaching terminals to the p-type and n-type semiconductor materials, and providing a layer of light transmissive material on the first surface of a light transmissive substrate to passivate the p-type and n-type semiconductor materials.

Preferably etching the multi-layer semiconductor substrate comprises at least two etching steps comprising a first etching step to remove p-type semiconductor material and a second etching step to remove n-type semiconductor material.

Preferably the light emitting diode device is fabricated with an edge for mounting the device and wherein the light emitting region of the device occupies a plane substantially perpendicular to a plane occupied by the edge for mounting the device.

Preferably the method further comprises providing a reflective or opaque mask on the light transmissive material for at least partially reflecting, re-directing and/or blocking light emissions in the first direction and/or enhancing light emissions in another, second, direction.

In a forth aspect the invention provides for, and there is disclosed herein, lighting assembly for providing a plurality of independently controllable lit regions, comprising a plurality of light emitting diode devices as hereinbefore mentioned mounted to a surface such that light emissions are parallel to a plane occupied by the surface and each light emitting device contributes light emissions to at least two lit regions.

Further aspects and disclosure of the invention are provided in and will become apparent from the following description.

BRIEF DESCRIPTION OF THE DRAWINGS

An exemplary form of the present invention will now be described by way of example only and with reference to the accompanying drawings, in which.

DESCRIPTION OF THE EXEMPLARY EMBODIMENTS

In the various drawings similar elements are identified by the same reference numerals.

Figure 3:
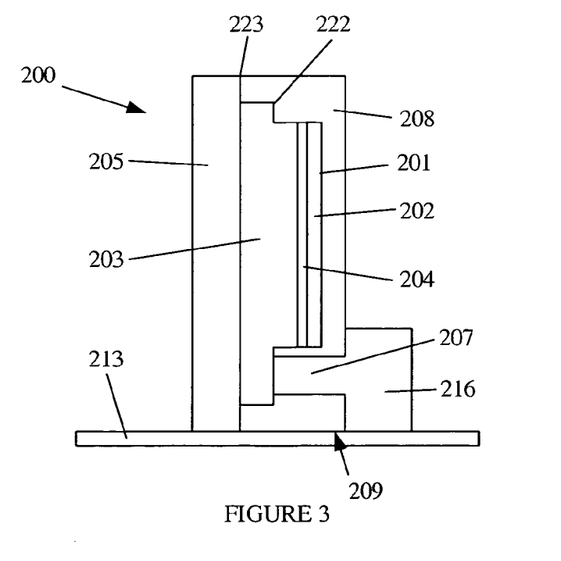
FIG. 3 is a schematic illustration of a light emitting diode device according the invention.
Figure 4:
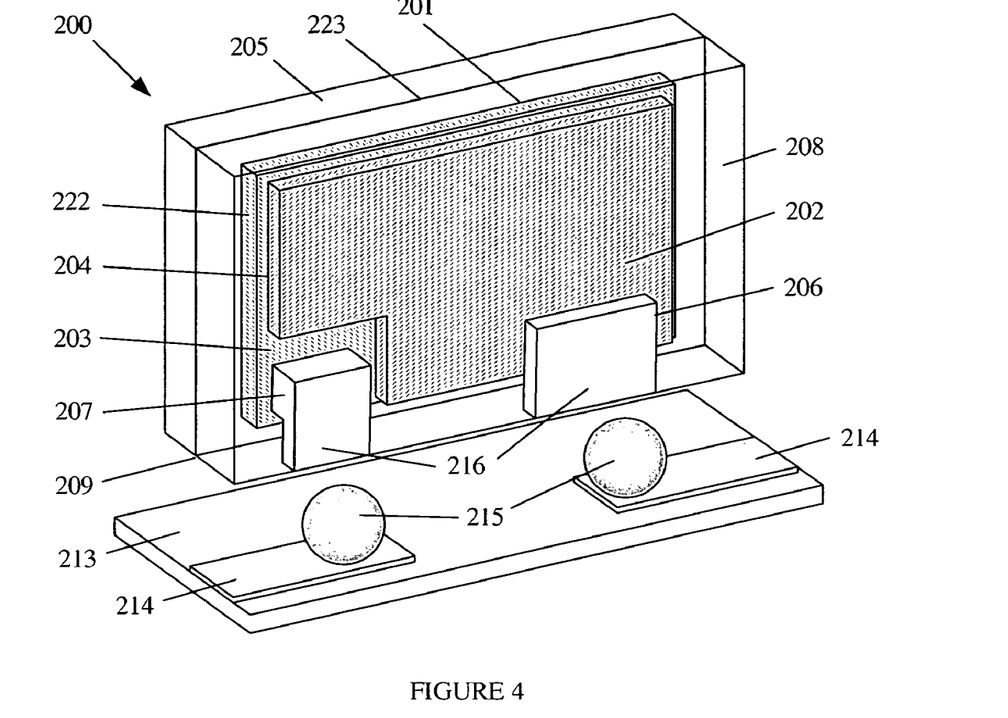
FIG. 4 is a perspective illustration of the light emitting diode device of FIG. 3.

FIGS. 3 and 4 schematically illustrate a first exemplary embodiment of a light emitting diode (LED) device 200 according to the present invention. The device comprises a multi-layer semiconductor substrate 201 having a first layer 202 of a p-doped or p-type semiconductor material and a second layer 203 of a n-doped or n-type semiconductor material. The two semiconductor layers 202, 203 are located together to form a p-n semiconductor junction. As is known in the art, a depletion layer is formed at the p-n junction that forms a light emitting region 204 of the LED device 200. When a voltage is applied across the p-n junction electrons and holes flow into the junction and when an electron meets a hole it falls into a low energy level which releases a photon. These light photons are emitted in all directions from the junction but the primary direction of emitted light is perpendicular to a plane occupied by the p-n junction between the p-type and n-type semiconductor layers 202, 203.

A p-terminal 206 and a n-terminal 207 are provided connected to the p-type and n-type semiconductor layers 202, 203 respectively for conducting power to the layers. The p- and n-terminals 206, 207 have contact pads 216 that overlap the perimeter 222 of the semiconductor substrate 201 to a position substantially in line with a mounting edge 209 of the LED device 200.

The semiconductor substrate 201 is formed on a light transmissive substrate 205. The light transmissive substrate 205 is preferably Sapphire and is larger than the semiconductor substrate 201 so that its perimeter 223 is greater than a perimeter 222 of the semiconductor substrate 201 and the semiconductor substrate 201 is entirely located within the perimeter 223 of the light transmissive substrate 205. A layer 208 of light transmissive material is provided on an opposite side of the semiconductor substrate 201 sandwiching the semiconductor substrate 201 between the light transmissive layer 208 and the light transmissive substrate 205. The light transmissive layer 208 is in contact with the light transmissive substrate 205 at its perimeter to totally passivate both the p-type and n-type layers 202, 203 of the semiconductor substrate 201. Contact surfaces of the n- and p-terminals 206, 207 are left exploded at the outer surface of the light transmissive layer 208 along the mounting edge 209 of the LED device 200.

Figure 5:
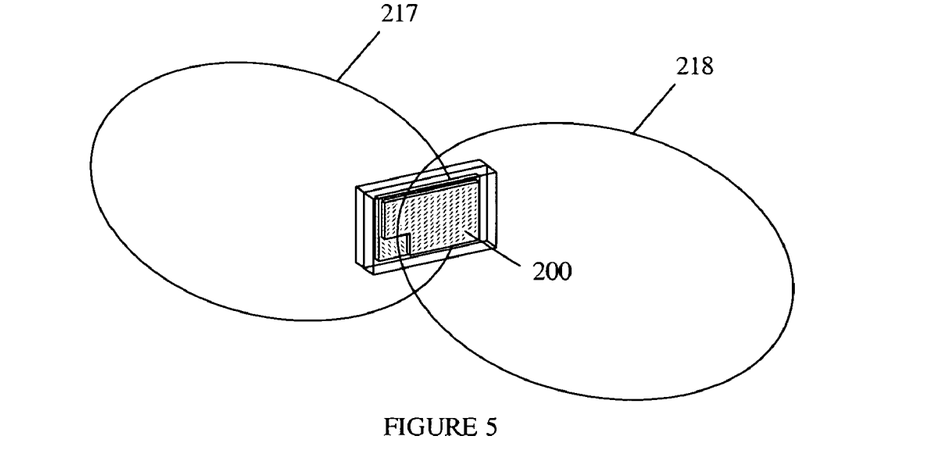
FIG. 5 illustrates the light emission pattern of the light emitting diode device of FIGS. 3 and 4.

The LED device 200 is fabricated to have a passive mounting edge 209 with adjacent p- and n-terminals 206, 207 so that the device 200 can be edge mounted on to a mounting surface 213 with the plane occupied by the light emitting region 204 perpendicular to a plane occupied by the mounting surface 213. The LED device 200 is secured to the mounting surface 213 as with a surface mount device by the exposed contact pads 216 of the p- and n-terminals 206, 207 bonded with solder balls 215 of an electrical circuit 214 on the mounting surface 213. The mounting surface 213 can be a printed circuit board (PCB) or other mounting substrate known in the art. The edge mounted LED device 200 has primary light emission directions that are parallel to the plane occupied by the mounting surface 213. If the light transmissive layer 208 and light transmissive substrate 205 have substantially similar refractive indexes then the light emission patterns 217, 218 of the LED device in the primary directions will be a substantially uniform ovoid shapes as illustrated in FIG. 5.

Figure 10:
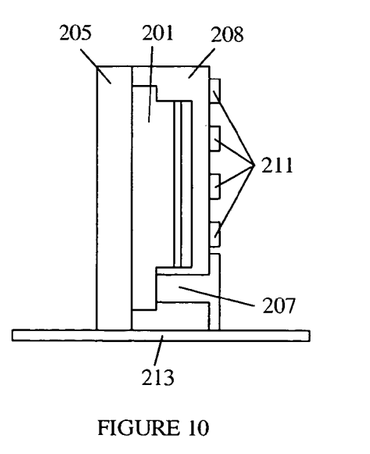
FIG. 10 is a schematic illustration of a forth embodiment of a light emitting diode device according the invention.

In some applications it may be desirable that the light emission pattern of the LED device is not uniform but is enhanced in one or more directions. In various alternative embodiments of the invention, depicted in FIGS. 6, 8 and 10, a reflective or opaque mask 210, 211 is provided on an outer surface of either or both the light transmissive layer 208 and/or light transmissive substrate 205 for directing at least a portion of emitted light from the semiconductor substrate 201 in a direction away from the primary emission direction to enhance light emission in another direction. The reflective or opaque masks 210, 211 are patterned to allow at least a portion of the light to propagate through the mask with the remaining light being blocked or reflected in another direction. A detailed discussion of a light emitting diode device and method of fabricating the device for re-directing emitted light using this technique is described in Assignees co-pending application (light emitting diode device and manufacture and use thereof) the contents of which are incorporated herein by reference.

Figure 6:
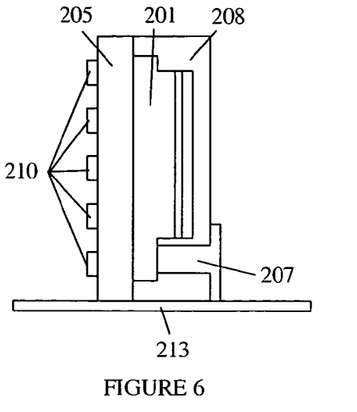
FIG. 6 is a schematic illustration of a second embodiment of a light emitting diode device according the invention.
Figure 7:
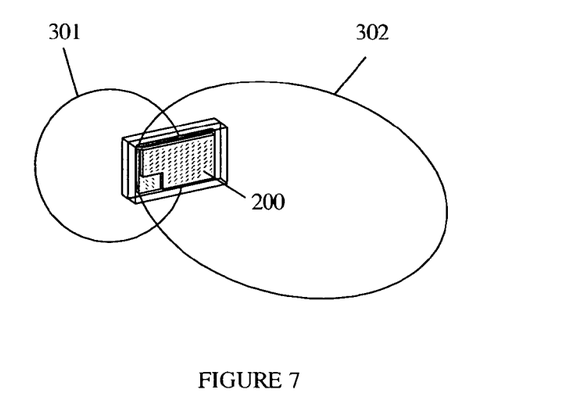
FIG. 7 illustrates the light emission pattern of the light emitting diode device of FIG. 6.
Figure 11:
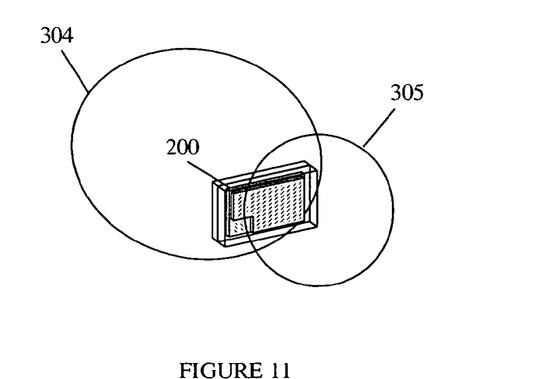
FIG. 11 illustrates the light emission pattern of the light emitting diode device of FIG. 10, FIGS. 12a-12d illustrate schematically stages in a method of fabricating the light emitting diode device of FIGS. 3 and 4, FIG. 13a-13c illustrate schematically fifth, sixth and seventh embodiments, respectively, of a light emitting diode device according the invention.

Referring to FIG. 6, by providing a reflective or opaque mask, represented here by reference numeral 210, on the outer surface of the light transmissive substrate 205 light emission 301 from the semiconductor junction in the primary direction towards the light transmissive substrate 205 is at least partially reflected towards the other primary emission direction or is blocked so that the light emission 302 is enhanced in the direction of the light transmissive layer 208 as illustrated by FIG. 7. FIG. 11 demonstrates the opposite configuration wherein a reflective or opaque mask 211 is located on the outer surface of the light transmissive layer 208 so that light emission 305 in that direction is reflected or blocked enhancing light emission 304 in the opposite direction as illustrated by FIG. 11.

Figure 8:
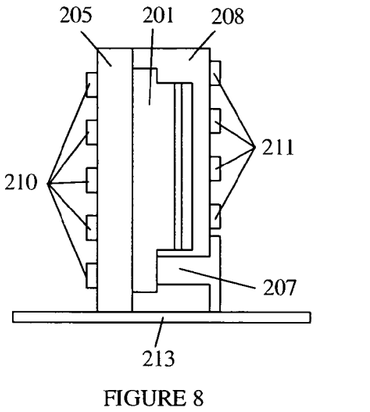
FIG. 8 is a schematic illustration of a third embodiment of a light emitting diode device according the invention.
Figure 9:
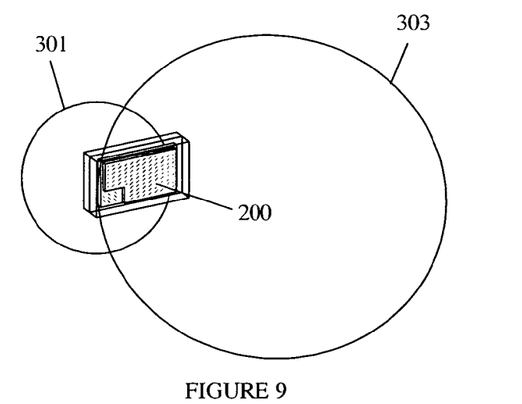
FIG. 9 illustrates the light emission pattern of the light emitting diode device of FIG. 8.

FIG. 8 illustrates an embodiment of the LED device where reflective or opaque masks 210, 211 are located on both the light transmissive substrate 205 and the light transmissive layer 208 thus reflecting or blocking light emissions in both primary directions and enhancing sideways light emission 303 of the LED device 200. The field distribution pattern of this configuration is illustrated in FIG. 9 and is more oval than ovoid.

The emission of light in one direction can be enhanced further by providing one of the light transmissive substrate or light transmissive layer with a refractive index greater than the refractive index of the other light transmissive medium. Light reflection is reduced when light passes from a medium with a lower refractive index to a medium with a greater refractive index and light reflection is enhanced when light passes in the opposite direction, i.e. from a medium of greater refractive index to a medium of lower refractive index. In combination with a reflective or opaque mask discussed above variations in refractive index can assist in re-directing light to enhance sideways light emission of the LED device.

Figure 12A:
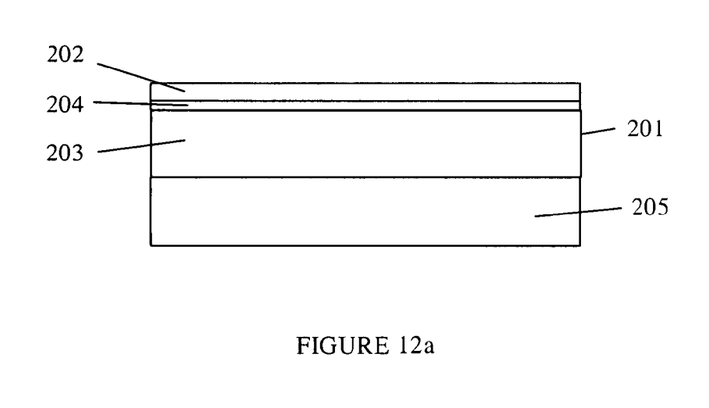
Figure 12B:
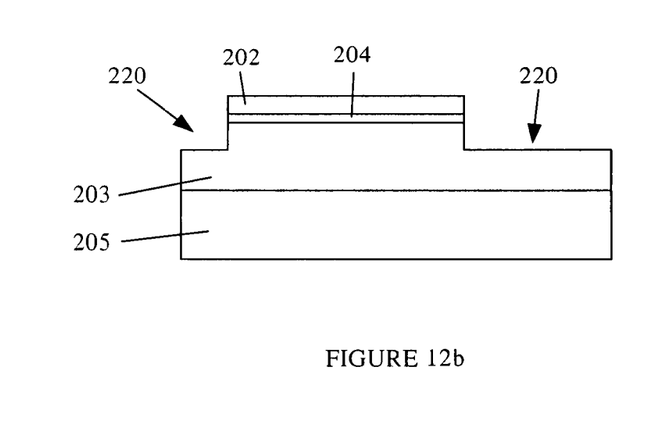
Figure 12C:
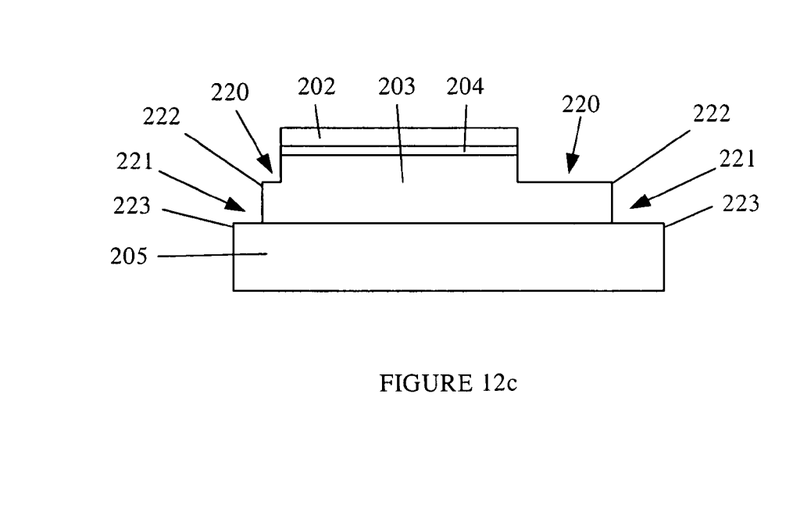

FIGS. 12a through 12d illustrate a method of fabricating a LED device 200 according to the invention. Firstly, as illustrated in FIG. 12a, a semiconductor substrate 201 having a p-type semiconductor layer 202 and a n-type semiconductor layer 203 forming a p-n junction 204 is formed on a light transmissive substrate 205 such as Sapphire. Next, referring to FIG. 12b, using a first etching 220 the perimeter of the p-type layer 202 and a portion of the thickness of the n-type layer 203 is removed. On one edge of the semiconductor substrate 201 where the n-terminal 207 is located the etching 220 is set back to create a larger shoulder in the n-type material 203. Referring to FIG. 12c, the third step is a second etching 221 to remove the perimeter of the remaining n-type material 203 down to the light transmissive Sapphire substrate 205 entirely around the perimeter 222 so that the semiconductor substrate 201 is smaller than the light transmissive Sapphire substrate 205.

Figure 12D:
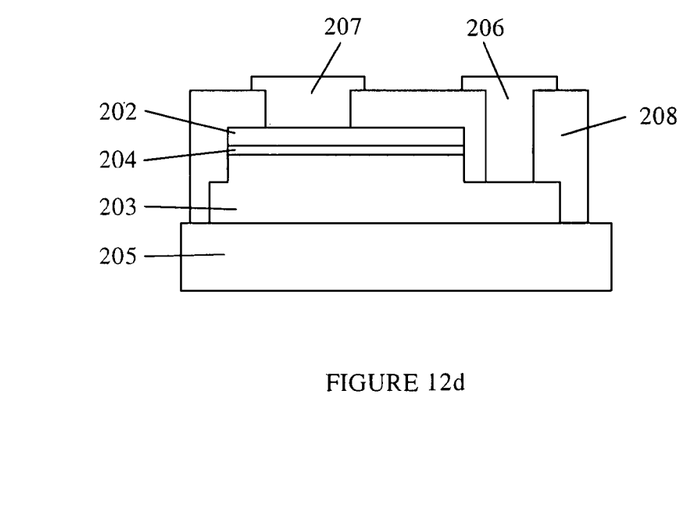

The last two steps are illustrated in FIG. 12d. The p- and n-terminals 206, 207 are bonded with the p-type and n-type semiconductor layers 202, 203 respectively in known manner. A layer of light transmissive semiconductor material 208 such as Silica ($SiO_2$) is provided on the semiconductor 201 and Sapphire 205 substrates covering the semiconductor substrate 201 and bonding with the perimeter of the light transmissive Sapphire substrate 205. The p-type and n-type semiconductor layers 202, 203 of the semiconductor substrate 201 are entirely passivated by the light transmissive Silica layer 208. Contact pads 216 of the p- and n-terminals 206, 207 are left exploded on an edge surface of the Silica layer 208 for bonding to a mounting surface 213 and powering the LED device.

Figure 13A:
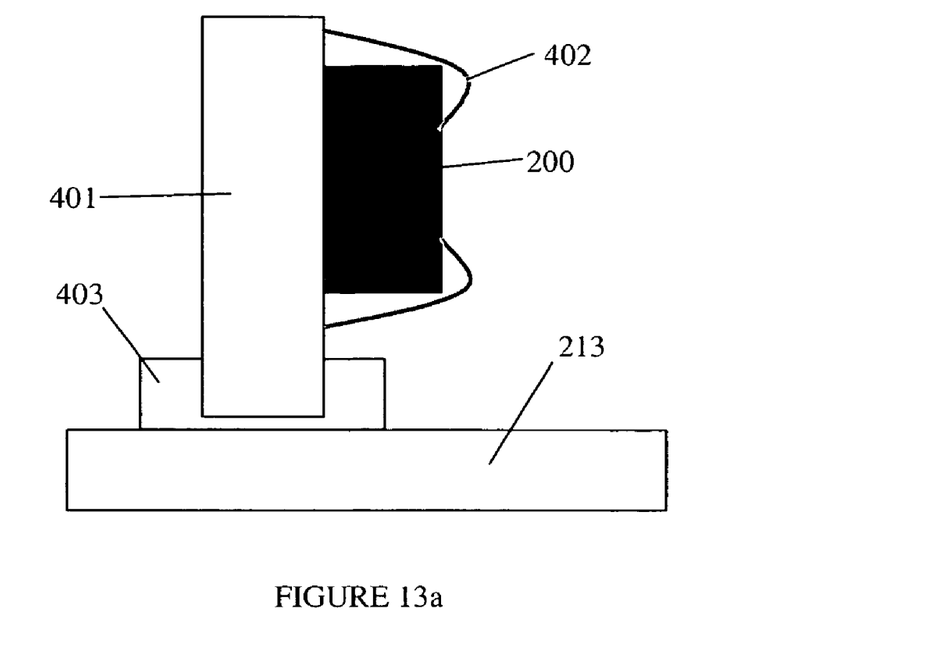
Figure 13B:
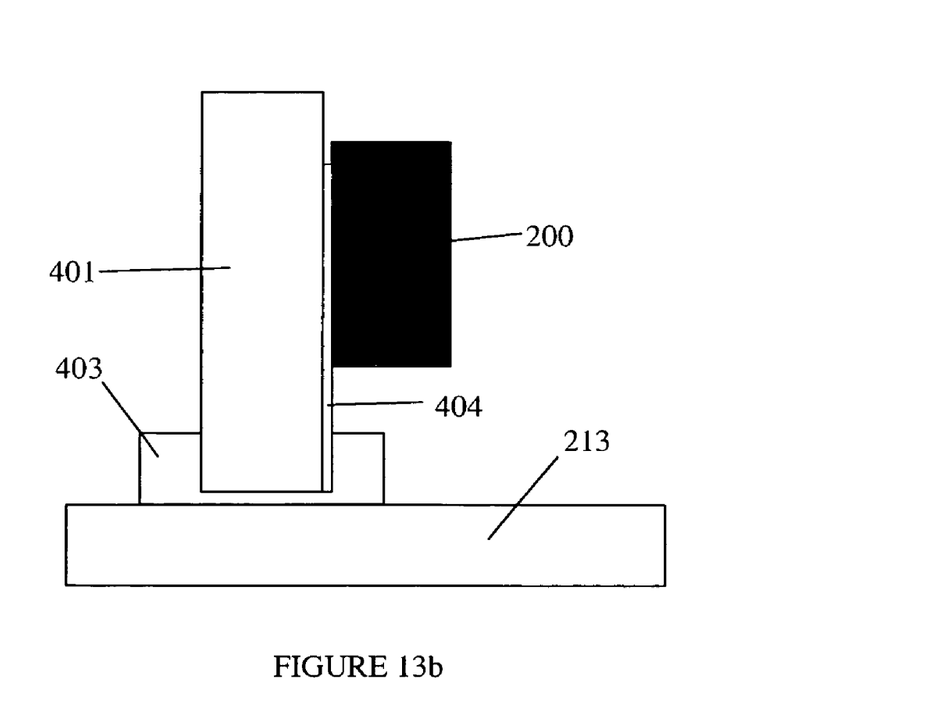
Figure 13C:
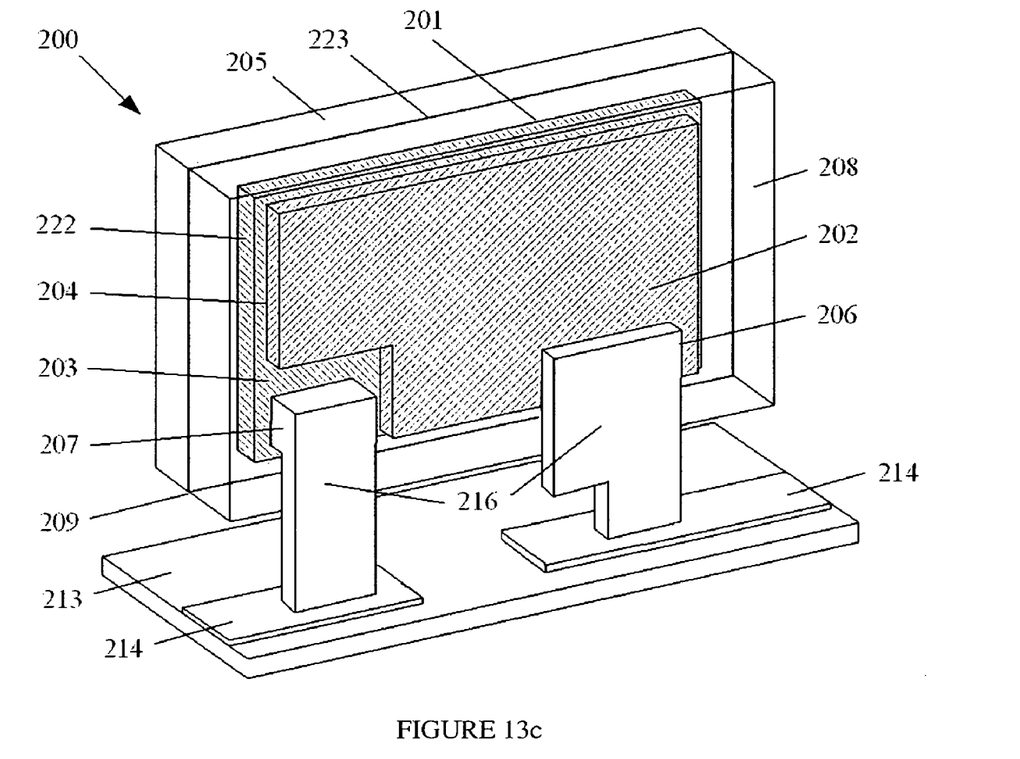

FIGS. 13a-13c illustrate an alternative mounting arrangements of the LED device 200 having its light emitting region 204 occupying a plane substantially perpendicular to a plane occupied by the mounting surface 213. In FIG. 13a the LED device 200 is mounted to a sub-mount substrate 401 with bonding wires 402 connecting the p- and n-terminals 206, 207 to sub-circuits of the sub-mount substrate 401. The sub-mount substrate 401 is mounted vertically on the mounting surface 213, for example a LCD backlight panel or a motherboard, via a connector 403. The sub-mount substrate 401 can be transparent or otherwise as required by the design. This mounting arrangement may have particular utility in a LCD panel backlighting system wherein a light module comprises a plurality of LED devices 200 arranged in a row on a transparent sub-mount substrate. A plurality of the light modules are mounted to the backlight panel via connectors to form a grid array of LEDs for the backlight. The same light modules can be used on different sized backlight panels providing manufacturing and assembly versatility and lighting modules can be replaced easily during maintenance or repair of the LCD screen.

FIG. 13b shows a variation on the arrangement of FIG. 13a wherein the LED device 200 is surface-mounted to the sub-mount substrate 401. The p- and n-terminals 206, 207 are bonded with a mounting pad 404 of the sub-mount substrate 401. FIG. 13c should a traditional leg mounting arrangement whereby the p- and n-terminals 206, 207 are extended to traditional component legs which are soldered to the circuit tracks 214 of the surface 213 in traditional manner. In each of the alternative embodiments of FIG. 13a-13c the LED device 200 is fabricated such that in use its light emitting region 204 occupies a plane substantially perpendicular to a plane occupied by the mounting surface 213.

Figure 14A:
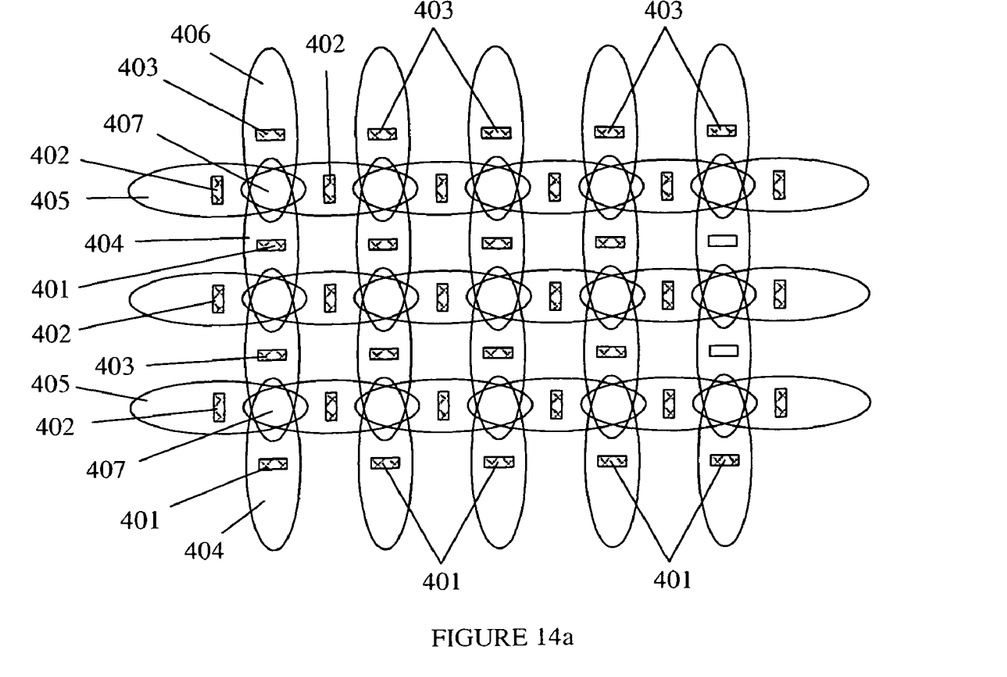
FIGS. 14a and 14b illustrate grid and hexagon matrix arrays comprising a plurality of light emitting diode devices according the invention for use in LCD panel backlighting systems.
Figure 14B:
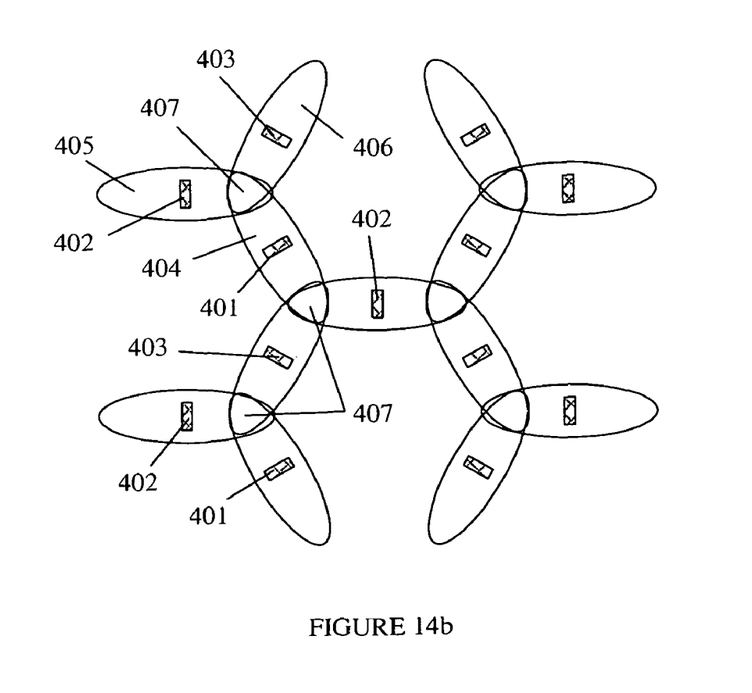

An edge mounted LED device 200 having uniform light emission patterns 216, 217 in two directions parallel to its mounting surface 213 has an advantage over known Top-emitting 100 and Flip-chip 102 LEDs for display and back-lighting applications. In particular, the edge mount LED device 200 has advantageous application in backlighting systems for liquid crystal display (LCD) panels. FIGS. 14a and 14b illustrate grid and hexagon matrix arrays for providing independently controllable lit regions in a backlighting for a LCD panel. The plurality LED devices can be individually and dynamically illuminated at varying light output intensities dependent upon the brightness of an image displayed in a corresponding division area of the LCD panel being backlit. Backlight systems of this type are described in United States patent publications 2005/0231978 and 2006/0007103, the contents of which are included herein by reference. The individual LED devices in the matrix arrays can be a signal white LED or a tri-colour combination of red, green and blue LEDs for providing dynamic color backlighting.

Referring to FIG. 14a, a grid matrix array for providing backlighting to a LCD panel can comprise a plurality of LED devices arranged in a grid of rows and columns. Each row, for example, may comprise a plurality of blue LED devices 402 mounted with their primary light emission directions orientated along the rows to create blue ovoid light patterns 205 in rows across the backlighting device. Each column of the backlighting device can comprises a sequence of green LEDs 403 and red LEDs 401 mounted perpendicular to the blue LEDs 204 with their primary light emission directions orientated along the columns to create columns of alternate green and red ovoid light patterns 406 and 404. At each intersection of a row and a column the red, blue and green ovoid light patterns 404, 405, 406 intersect creating a white light region 407.

Referring to FIG. 14b, in a hexagon matrix array the red, blue and green LEDs 401, 402, 403 are mounted along edges of a hexagonal pattern creating red, blue and green ovoid light patterns 404, 405, 406 projecting at 60° angles to each other. The light patterns intersect at vertexes of the hexagonal pattern creating white illumination areas 407.

The light output intensity of each LED device in the patterns of FIGS. 14a and 14b can be controlled individually based on image brightness information of a corresponding area of an image shown on a LCD panel.

Figure 15:
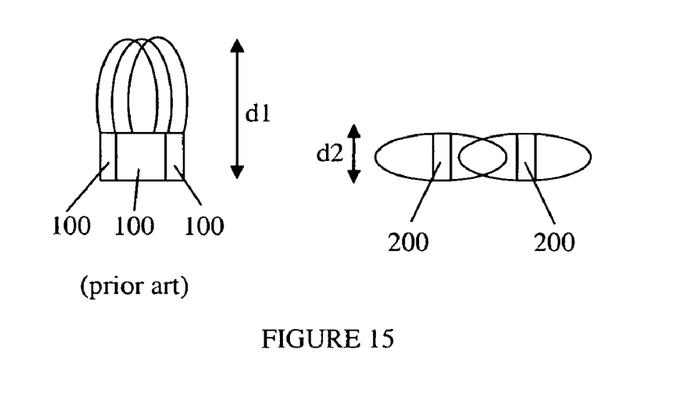
FIG. 15 is a comparison of light emission profiles of prior art light emitting diodes and a light emitting diode device according the invention.

The LED lighting arrangements illustrated in FIGS. 14a and 14b that can be achieved using a LED device 200 according to the invention have advantages over prior art LED lighting arrangements available hitherto, particularly those used in LCD panel backlighting systems. As illustrated in FIG. 15, prior art LEDs 100 having a forward projecting primary light emission direction requiring a minimum backlight panel thickness of, say, d1, whereas LEDs 200 according the invention have a transverse, or sideways, primary light emission direction allowing for a thinner backlight panel thickness of, say, d2. Additionally, in a colour backlight system each white light region 407 is achieved using a group of one red, one green and one blue LED. Thus to achieve, say, fifteen white light regions 407 as illustrated in FIG. 14a a total of 45 individual prior art LEDs 100 are required. However, a LED device 200 according to the invention can contributes light to two white regions 407 meaning that fewer individual LED devices are needed. The fifteen white light regions 407 of FIG. 14a can be achieved using only 28 individual LED devices 200 according to the invention. Thus the component count is substantially reduced.

It should be appreciated that modifications and/or alterations obvious to those skilled in the art are not considered as beyond the scope of the present invention. For example, the light transmissive layer of the described embodiments is Silica, but it may be epoxy, polymeric material, glass or the like. In the described embodiments the light transmissive substrate is Sapphire but may be another suitable material known in the art. Furthermore, to enhance conductivity the n- and p-terminals for supplying power to the n-type and p-type semiconductor layers respectively conductive and transparent layers, such as ITO thin film, can be sandwiched between the p- and n-terminal electrodes and the respective semiconductor layers for enhancing conduction there between.

The described embodiment is a simple rectangular shaped LED device that is simple to fabricate and is not unnecessarily bulky. However, this is not intended to limit the scope of use or functionality of the invention. The skilled addressee will appreciate that the device may also include optical or other designs to enhance, improve and/or re-distribute light emissions from certain surfaces or in certain directions of the LED device.

What is claimed is:

1. A light emitting diode device, for mounting on a surface, comprising a semiconductor substrate having a layer of p-type semiconductor material adjoining a layer of n-type semiconductor material and a light emitting region occupying a plane between the p- and n-type materials, a light transmissive substrate on which the semiconductor substrate is formed, the light transmissive substrate having a perimeter greater than a perimeter of the semiconductor substrate, a first terminal electrically connected to the p-type semiconductor material layer and a second terminal electrically connected to the n-type semiconductor material layer, each of said terminals comprising a contact pad which overlaps with the perimeter of the semiconductor substrate and which extends to at least the perimeter of the light transmissive substrate to thereby be exposed to enable the diode device to be electrically bonded to an electrical circuit on the mounting surface, wherein the light emitting diode device is fabricated for mounting with the plane occupied by the light emitting region substantially perpendicular to a plane occupied by the mounting surface and wherein a primary light emission direction of the light emitting region is parallel to the plane occupied by the mounting surface.

2. The light emitting diode device of claim 1 wherein the p- and n-type materials are completely passivated by one or more light transmissive layers.

3. A light emitting diode device for mounting on a surface occupying a first plane and having first and second primary light emission directions parallel to the first plane, the light emitting diode device comprising:

a multi-layer semiconductor substrate comprising a first layer of a p-type semiconductor material, a second layer of a n-type semiconductor material located with the first layer forming a junction between the p- and n-type semiconductor materials and a light emission region occupying a second plane at the junction, a light transmissive substrate on which the multi-layer semiconductor substrate is formed, the light transmissive substrate having a perimeter greater than a perimeter of the multi-layer semiconductor substrate, a first terminal electrically connected to the p-type semiconductor material layer and a second terminal electrically connected to the n-type semiconductor material layer, each of said terminals comprising a contact pad which overlaps with the perimeter of the multi-layer semiconductor substrate and which extends to at least the perimeter of the light transmissive substrate to thereby be exposed to enable the diode device to be electrically bonded to an electrical circuit on the mounting surface, and the light emitting diode device being fabricated for mounting on the surface with the second plane occupied by the light emission region substantially perpendicular to the first plane occupied by the surface.

4. The light emitting diode device of claim 3 wherein the first and second terminals are located adjacent an edge of the light emitting diode device for making electrical connection with a circuit on the surface.

5. The light emitting diode device of claim 3 further comprising a light transmissive layer located on the semiconductor substrate and wherein the semiconductor substrate is sandwiched between the light transmissive substrate and the light transmissive layer.

6. The light emitting diode device of claim 5 wherein the p- and n-type semiconductor materials are passivated by the light transmissive layer.

7. The light emitting diode device of claim 5 wherein the light transmissive layer has a refractive index substantially similar to the refractive index of the light transmissive substrate.

8. The light emitting diode device of claim 3 further comprising a substantially light transmissive layer located at or adjacent the semiconductor substrate and having a first surface facing the semiconductor substrate and an opposed second surface, and a reflective surface formed at or adjacent the second surface of the light transmissive layer for directing at least a portion of emitted light in a direction away from the first emission direction so as to enhance light emission in the second emission direction.

9. The light emitting diode device of claim 8 wherein the reflective surface is patterned to allow at least a portion of the light to propagate through the reflective surface.

10. The light emitting diode device of claim 3 further comprising a substantially light transmissive layer located at or adjacent the semiconductor substrate and having a first surface facing the semiconductor substrate and an opposed second surface, and a mask formed at or adjacent the second surface of the light transmissive layer for directing at least a portion of emitted light in the first emission direction, wherein the mask is patterned to allow at least a portion of the light to propagate through the mask.

11. An edge-mount light emitting diode device, for mounting on a surface, fabricated from a semiconductor substrate such that in use a light emitting region of the device defined in the semiconductor substrate occupies a plane substantially perpendicular to a plane occupied by the mounting surface, the light emitting region of the device being totally passivated by at least one light transmissive layer having a perimeter greater than a perimeter of the semiconductor substrate such that light from said light emitting region emits into said at least one light transmissive layer in at least two opposing directions parallel to a plane occupied by said mounting surface, wherein contact pads of electrically conductive terminals connected to respective p-type and n-type layers of the semiconductor substrate which define the light emitting region extend to at least the perimeter of the at least one light transmissive layer to thereby be exposed to enable the diode device to be electrically bonded to an electrical circuit on the mounting surface.

12. The edge-mount light emitting diode device of claim 11, wherein the p-type and n-type semiconductor layers are passivated by the light transmissive layer.

13. The edge-mount light emitting diode device of claim 11 comprising a reflective or opaque mask located at or adjacent a first light emission direction of the light emitting region for at least partially reflecting, re-directing and/or blocking light emissions in the first direction and/or enhancing light emissions in another, second, direction.

14. A lighting assembly for providing a plurality of independently controllable lit regions, comprising:

a mounting surface for mounting a plurality of light emitting diode devices, and a plurality of light emitting diode devices fabricated for mounting to the mounting surface with a plane occupied by light emitting regions of the devices substantially perpendicular to a plane occupied by the mounting surface such that light emissions of the light emitting regions are parallel to the plane occupied by the mounting surface, wherein the plurality of light emitting diode devices are arranged on the mounting surface so that each light emitting device contributes light emissions to at least two opposed lit regions and wherein each light emitting device is fabricated from a semiconductor substrate such that a light emitting region of said device defined in the semiconductor substrate is totally passivated by at least one light transmissive layer having a perimeter greater than a perimeter of the semiconductor substrate, wherein contact pads of electrically conductive terminals connected to respective p-type and n-type layers of the semiconductor substrate which define the light emitting region extend to at least the perimeter of the at least one light transmissive layer to thereby be exposed to enable the diode device to be electrically bonded to an electrical circuit on the mounting surface.

15. The lighting assembly of claim 14 wherein the light emitting diode devices comprises red light emitting devices, green light emitting devices and blue light emitting devices and wherein the light emitting devices are arranging on the mounting surface so that at least one red, one green and one blue light emitting device contributes light emissions to each lit region.

16. The lighting assembly of claim 14 wherein the light emitting diode devices are arranged in a grid or hexagon pattern on the mounting surface.

17. The lighting assembly of claim 14 used as a backlight for a liquid crystal display panel and having a plurality of independently controllable lit regions for providing backlighting to a corresponding plurality of division areas of the liquid crystal display panel.

18. A light emitting diode device, for mounting on a surface, comprising a semiconductor substrate having a layer of p-type semiconductor material adjoining a layer of n-type semiconductor material and a light emitting region occupying a plane between the p- and n-type materials, wherein the light emitting diode device is fabricated for mounting with the plane occupied by the light emitting region substantially perpendicular to a plane occupied by the mounting surface and wherein the light emitting region of the device is totally passivated by at least one light transmissive layer such that light from said light emitting region emits into said at least one light transmissive layer in at least two opposing directions, wherein the at least one light transmissive layer has a perimeter greater than a perimeter of the semiconductor substrate and contact pads of electrically conductive terminals connected respectively to the p-type and n-type layers of the semiconductor substrate extend to at least the perimeter of the at least one light transmissive layer to thereby be exposed to enable the diode device to be electrically bonded to an electrical circuit on the mounting surface.

19. An edge-mount light emitting diode device, for mounting on a surface, fabricated such that in use a light emitting region of the device occupies a plane substantially perpendicular to a plane occupied by the mounting surface, wherein the semiconductor substrate has first and second terminals for powering said light emitting region, each of said terminals comprising a contact pad which overlaps with a perimeter of the semiconductor substrate, the edge-mount light emitting diode device including a light transmissive substrate on which the semiconductor substrate is formed, the light transmissive substrate having a perimeter greater than a perimeter of the semiconductor substrate, wherein contact pads of each of said terminals extend to at least the perimeter of the light transmissive substrate to thereby be exposed to enable the diode device to be electrically bonded to an electrical circuit on the mounting surface.

* * * * *